(12) United States Patent
Goda et al.

(10) Patent No.: US 6,525,160 B1
(45) Date of Patent: Feb. 25, 2003

(54) EPOXY RESIN COMPOSITION AND PROCESS FOR PRODUCING SILANE-MODIFIED EPOXY RESIN

(75) Inventors: Hideki Goda, Kyotanabe (JP); Tetsuji Higashino, Osaka (JP)

(73) Assignee: Arakawa Chemical Industries Ltd., Osaka (JP)

( * ) Notice: Subject to any disclaimer, the term of this patent is extended or adjusted under 35 U.S.C. 154(b) by 0 days.

(21) Appl. No.: 09/743,778

(22) PCT Filed: Jun. 16, 2000

(86) PCT No.: PCT/JP00/03920

§ 371 (c)(1),
(2), (4) Date: Jan. 12, 2001

(87) PCT Pub. No.: WO00/78838

PCT Pub. Date: Dec. 28, 2000

(30) Foreign Application Priority Data

| Jun. 17, 1999 | (JP) | 11-170406 |
| Jun. 17, 1999 | (JP) | 11-170411 |
| Jul. 23, 1999 | (JP) | 11-208481 |
| Mar. 1, 2000 | (JP) | 2000-55859 |

(51) Int. Cl.[7] .......................... C08G 65/336
(52) U.S. Cl. .................. 528/29; 528/27; 528/81; 528/112; 528/121; 528/123
(58) Field of Search ............... 528/27, 29, 87, 528/112, 121, 123

(56) References Cited

U.S. PATENT DOCUMENTS

| 3,170,962 A | * | 2/1965 | Tyler | |
| 4,354,013 A | | 10/1982 | Kimura | 528/16 |
| 4,436,787 A | | 3/1984 | Mikami et al. | 428/447 |
| 4,474,930 A | * | 10/1984 | Mikami et al. | 525/476 |
| 4,808,483 A | | 2/1989 | Nakasuji et al. | 428/447 |
| 4,926,239 A | * | 5/1990 | Fujita et al. | |
| 5,102,960 A | * | 4/1992 | Imai et al. | |
| 5,248,710 A | | 9/1993 | Shiobara et al. | 523/435 |

FOREIGN PATENT DOCUMENTS

| JP | 60-067542 A | * | 4/1985 |
| JP | 61272243 | | 12/1986 |
| JP | 61272244 | | 12/1986 |
| JP | 61272245 | | 12/1986 |
| JP | 61278537 | | 12/1986 |
| JP | 61283628 | | 12/1986 |
| JP | 01-048818 A | * | 2/1989 |
| JP | 01-152151 A | * | 6/1989 |
| JP | 02-296858 A | * | 12/1990 |
| JP | 06-270184 A | * | 9/1994 |

OTHER PUBLICATIONS

"Partial Translation of Japanese Unexamined Patent Publication No. 01–48818.".
"McGraw–Hill Dictionary of Scientific and Technical Terms," 2nd Ed., p. 1491.

* cited by examiner

Primary Examiner—Robert Dawson
Assistant Examiner—Marc S Zimmer
(74) Attorney, Agent, or Firm—Baker Botts LLP

(57) ABSTRACT

The present invention provides an epoxy resin composition which comprises an alkoxy-containing silane-modified epoxy resin (A) which is obtainable by dealcoholization condensation reaction between a bisphenol epoxy resin (1) and hydrolyzable alkoxysilane (2); and a curing agent (B) for epoxy resin. The present invention also provides a method for preparing an alkoxy-containing silane-modified epoxy resin, the method comprising dealcoholization condensation reaction between the bisphenol epoxy resin (1) and the hydrolyzable alkoxysilane (2).

12 Claims, 3 Drawing Sheets

EPOXY RESIN COMPOSITION AND PROCESS FOR PRODUCING SILANE-MODIFIED EPOXY RESIN

CROSS-REFERENCE TO RELATED APPLICATIONS

This application is a national phase application of International Application No. PCT/JP00/03920, which was filed on Jun. 16, 2000 and which published in Japanese on Dec. 28, 2000, which in turn claims priority from Japanese Application No. 11/170406, which was filed on Jun. 17, 1999, Japanese Application No. 11/170411, which was filed on Jun. 17, 1999, Japanese Application No. 11/280481, which was filed on Jul. 23, 1999, and Japanese Application No. 2000/55859, which was filed on Mar. 1, 2000.

TECHNICAL FIELD

The present invention relates to an epoxy resin composition and a method for preparing a silane-modified epoxy resin.

BACKGROUND ART

Epoxy resins have been used usually in combination with curing agents in the field of electric and electronic materials. The recent development in the electric and electronic material field has been requiring high-performance cured products of epoxy resin compositions. In particular, improved heat resistance is desired.

In order to improve the heat resistance of the cured products of the epoxy resin compositions, the compositions containing glass fibers, glass particles, mica and like fillers in addition to epoxy resins and curing agents are used. However, these methods using fillers can not impart sufficient heat resistance to the resin compositions. By these methods, the transparency of the resulting cured products is deteriorated and the interfacial adhesion between the fillers and epoxy resins is lowered. Thus, the cured products are given insufficient mechanical properties such as elongation rate.

Japanese Unexamined Patent Publication No. 1996-100107 proposes a method for improving the heat resistance of cured products of epoxy resin compositions by using the complex of an epoxy resin and silica. The complex of an epoxy resin and silica is prepared by adding hydrolyzable alkoxysilane to a solution of a partially cured epoxy resin to further cure the partially cured product; hydrolyzing the alkoxysilane to cause solation; and polycondensing the sol to cause gelation. The heat resistance of the cured product prepared from such complex is improved to some extent compared to the cured product of the epoxy resin by itself. However, water contained in the complex or water and alcohols produced during curing cause voids (air bubbles) inside the cured product. Further, increasing the amount of alkoxysilane to further improve the heat resistance of the cured product results in impaired transparency and whitening of the product due to the aggregation of silica produced by sol-gel curing reaction. In addition, solation of a large amount of the alkoxysilane necessitates a large amount of water, which leads to the bends and cracks in the cured product.

Also proposed are a composition which is produced by combining a silane-modified epoxy resin prepared by reacting the epoxy resin with a silicone compound, and a phenol novolac resin as a curing agent (Japanese Unexamined Patent Publication No. 1991-201466); and a composition prepared by combining a silane-modified epoxy resin produced by reacting bisphenol A epoxy resin, tetrabromobisphenol A and a methoxy-containing silicone intermediate, and a phenol novolac resin as a curing agent (Japanese Unexamined Patent Publications No. 1986-272243, No. 1986-272244). However, the cured products of these epoxy resin compositions do not have sufficient heat resistance since the main structural unit of the silicone compound and methoxy-containing silicone intermediate is a diorganopolysiloxane unit which can not produce silica.

DISCLOSURE OF INVENTION

An object of the present invention is to provide a novel epoxy resin composition and a method for preparing a silane-modified epoxy resin which is free from the aforementioned problems of the prior art.

Another object of the present invention is to provide a novel epoxy resin composition which is capable of providing cured products having high heat resistance and no voids or cracks using a specific silane-modified epoxy resin, and a method for preparing said silane-modified epoxy resin.

Other objects and features of the present invention will be apparent from the following description.

The present invention provides an epoxy resin composition comprising an alkoxy-containing silane-modified epoxy resin (A) which is obtainable by dealcoholization condensation reaction between a bisphenol epoxy resin (1) and hydrolyzable alkoxysilane (2); and a curing agent (B) for epoxy resin.

Further, the present invention provides a method for preparing an alkoxy-containing silane-modified epoxy resin, the method comprising dealcoholization condensation reaction between the bisphenol epoxy resin (1) and the hydrolyzable alkoxysilane (2).

The inventors of the present invention conducted extensive research to solve the above-mentioned problems of the prior art. Consequently, the inventors found the following: by using the epoxy resin composition comprising a specific silane-modified epoxy resin (A) obtained by dealcoholization condensation reaction of a bisphenol epoxy resin (1) and hydrolyzable alkoxysilane (2), and a curing agent (B) for epoxy resin, an epoxy resin-silica hybrid having high heat resistance and no voids or cracks can be obtained as a cured product. The present invention was accomplished based on this novel finding.

The raw material of the alkoxy-containing silane-modified epoxy resin (A) of the present invention, namely bisphenol epoxy resin (1), can be obtained by the reaction between bisphenols and epichlorohydrin or β-methylepichlorohydrin and like haloepoxides. Examples of the bisphenols include those obtained by the reaction between phenol or 2,6-dihalophenol and formaldehyde, acetaldehyde, acetone, acetophenone, cyclohexanone, benzophenone and like aldehydes or ketones; those obtained by oxidation of dihydroxyphenylsulfide with a peracid; and those obtained by etherification reaction of one or more hydroquinones.

In addition, the bisphenol epoxy resin (1) has a hydroxyl group which can form silicic acid ester by dealcoholization condensation reaction with the hydrolyzable alkoxysilane (2). Not all the molecules which constitute the bisphenol epoxy resin (1) need to have the hydroxyl group, but the bisphenol epoxy resin (1) itself needs to have the hydroxyl group.

The epoxy equivalent of the bisphenol epoxy resin (1) differs depending on the structure of the bisphenol epoxy resin (1). Therefore, the bisphenol epoxy resin (1) having an epoxy equivalent suitable for its application may be selected. Usually, the epoxy equivalent is preferably about 180 to about 5,000 g/eq. The epoxy equivalent lower than 180 g/eq decreases the amount of alcoholic hydroxyl groups which react with the hydrolyzable alkoxysilane (2) in the epoxy resin molecule. This leads to the reduced formation of the bonds between the epoxy resin (1) and alkoxysilane (2) caused by dealcoholization reaction. As a result, in the epoxy resin-silica hybrids produced when the alkoxy-containing silane-modified epoxy resin (A) is cured with the curing agent (B), insufficient bonding between the silica and epoxy resin occurs. This prevents silica from being uniformly dispersed in the resin. Thus, the cured product is likely to be unfavorably whitened because of the phase separation of the silica and epoxy resin in the product. The epoxy equivalent higher than 5,000 g/eq increases the number of hydroxyl groups in the epoxy resin molecule. Thus, the epoxy resin is likely to disadvantageously undergo gelation during the dealcoholization condensation reaction with multifunctional hydrolyzable alkoxysilane (2). The above-specified epoxy equivalent of 180 to 5,000 g/eq corresponds to a number average molecular weight of 360 to 10,000.

As the bisphenol epoxy resin (1), bisphenol A epoxy resin obtained by using bisphenol A is particularly preferable because of its wide applicability and inexpensiveness.

The above bisphenol A epoxy resin is a compound represented by the formula

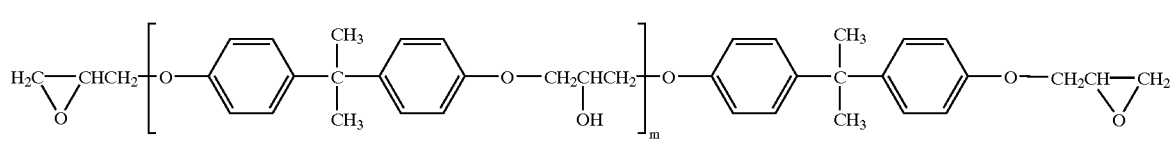

(I)

wherein the average of m is 0.07 to 16.4. The epoxy resin of the formula (I) may contain molecules for which m is 0 provided that it also contains molecules for which m is 1 or greater.

An epoxy compound having reactivity with the hydrolyzable alkoxysilane (2) may be used in combination with the bisphenol epoxy resin (1). Examples of the epoxy compound include glycidyl ester epoxy resins obtained by reacting phthalic acid, dimer acid and like polybasic acids with epichlorohydrin, and glycidol and the like. The amount of the epoxy compound to be used in combination is usually about 30 parts by weight or lower, based on 100 parts by weight of the bisphenol epoxy resin (1).

Furthermore, the hydrolyzable alkoxysilane (2) which forms the alkoxy-containing silane-modified epoxy resin (A) of the present invention includes, for example, a compound represented by the formula

(II)

(wherein p is 0 or 1; $R^1$ represents a $C_1$–$C_8$ alkyl group, aryl group or unsaturated aliphatic hydrocarbon group which may have a functional group directly bonded to a carbon atom; $R^2$ represents a hydrogen atom or a lower alkyl group and $R^2$'s may be the same or different from each other) or partial condensates thereof. Examples of the above functional group include vinyl group, mercapto group, epoxy group, glycidoxy group and the like. The lower alkyl group includes a straight-chain or branched-chain alkyl group which has 6 or less carbon atoms.

Examples of such hydrolyzable alkoxysilane (2) include tetramethoxysilane, tetraethoxysilane, tetrapropoxysilane, tetraisopropoxysilane, tetrabuthoxysilane and like tetraalkoxysilanes; methyltrimethoxysilane, methyltriethoxysilane, methyltripropoxysilane, methyltributhoxysilane, ethyltrimethoxysilane, ethyltriethoxysilane, n-propyltrimethoxysilane, n-propyltriethoxysilane, isopropyltrimethoxysilane, isopropyltriethoxysilane, vinyltrimethoxysilane, vinyltriethoxysilane, 3-glycidoxypropyltrimethoxysilane, 3-glycidoxypropyltriethoxysilane, 3-mercaptopropyltrimethoxysilane, 3-mercaptopropyltriethoxysilane, phenyltrimethoxysilane, phenyltriethoxysilane, 3,4-epoxycyclohexylethyltrimethoxysilane, 3,4-epoxycyclohexylethyltrimethoxysilane and like trialkoxysilanes; or partial condensates of these compounds.

Among these compounds, preferable are tetramethoxysilane, tetraethoxysilane and like tetraalkoxysilanes or partial condensates thereof. Particularly preferable is poly(tetramethoxysilane) which is a partial condensate of tetramethoxysilane represented by the formula

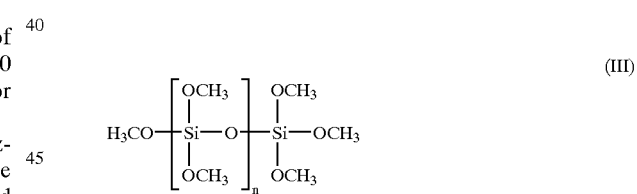

(III)

wherein the average of n is 1 to 7. The poly(tetramethoxysilane) represented by the formula (III) may contain a molecule in which n is 0 provided that the average of n is 1 or greater. The number average molecular weight of the poly(tetramethoxysilane) is preferably about 260 to about 1,200. In addition, the poly(tetramethoxysilane) is not toxic unlike tetramethoxysilane.

In the formula (III), n represents the average number of repeating units. When the value of n is less than 1, the amount of toxic tetramethoxysilane contained in the poly(tetramethoxysilane) increases. Accordingly, discharge of tetramethoxysilane together with methanol is likely to occur during demethanolization reaction. This is unfavorable in terms of safety and sanitation. When the value of n is greater than 7, the solubility of the poly(tetramethoxysilane) is lowered and the poly(tetramethoxysilane) tends to be insolubilized in the bisphenol epoxy resin (1) and organic solvents. This may unfavorably lower the reactivity between the poly(tetramethoxysilane) and the bisphenol epoxy resin (1).

As the hydrolyzable alkoxysilane (2), those mentioned as examples in the above can be used without any restriction.

When using trialkoxysilanes or their condensates, it is preferable that they are usually used in a proportion of 40% by weight or lower of the hydrolyzable alkoxysilane (2) in combination with tetraalkoxysilanes or their partial condensates.

The alkoxy-containing silane-modified epoxy resin (A) of the invention is prepared by dealcoholization condensation reaction between the above bisphenol epoxy resin (1) and the hydrolyzable alkoxysilane (2). This reaction produces said silane-modified epoxy resin in which part or all of the hydroxyl groups of the bisphenol epoxy resin are modified with the hydrolyzable alkoxysilane.

The used ratio of the bisphenol epoxy resin (1) to the hydrolyzable alkoxysilane (2) is not limited insofar as alkoxy groups substantially remains in the resulting alkoxy-containing silane-modified epoxy resin (A). The weight ratio of the hydrolyzable alkoxysilane (2) calculated as silica to the bisphenol epoxy resin (1) is preferably in the range of 0.01 to 3. In this specification, the weight calculated as silica can be calculated by multiplying the mole number of Si atoms of the hydrolyzable alkoxysilane and the molecular weight of silica ($R^1SiO_{1.5}$ or $SiO_2$).

However, when the bisphenol epoxy resin (1) is a macromolecular resin having an epoxy equivalent of 800 or greater and the ratio of an alkoxy equivalent of the hydrolyzable alkoxysilane (2)/a hydroxyl equivalent of the bisphenol epoxy resin (1) is about 1 (approximately equal in stoichiometry), the dealcoholization reaction is accelerated and therefore thickening and gelation of the solution may occur. In this case, the progress of the dealcoholization reaction needs to be controlled. Specifically, the above equivalent ratio is preferably adjusted to be lower than 1 or higher than 1 so that one of the hydroxyl equivalent of the bisphenol epoxy resin (1) and the alkoxy equivalent of the hydrolyzable alkoxysilane (2) is greater than the other. In particular, the above equivalent ratio is preferably adjusted to lower than 0.8 or higher than 1.2.

Further, when a macromolecular resin having an epoxy equivalent of 400 or higher is used as the bisphenol epoxy resin (1); the poly(tetramethoxysilane) of the above formula (a) is used as the hydrolyzable alkoxysilane (2); or the above equivalent ratio is about 1, it is not favorable to conduct the dealcoholization condensation reaction until either of the hydroxyl group of the bisphenol epoxy resin (1) or the alkoxy group of the hydrolyzable alkoxysilane (2) completely disappears. If either of (1) or (2) completely disappears, the molecular weight of the resulting product excessively increases in the reaction system. This may lead to thickening or gelation of the resulting product. In this case, thickening and gelation is prevented by stopping the dealcoholization reaction in the course of reaction or by other manners. For example, the reaction can be stopped in the manners of refluxing effluent alcohol when the thickening starts to adjust the amount of alcohol removed from the reaction system, cooling the reaction system or like manners.

The silane-modified epoxy resin (A) can be prepared, for example, by mixing the above-mentioned components and heating the mixture to remove produced alcohol to cause dealcoholization condensation reaction. The reaction temperature is about 50° C. to about 130° C., preferably about 70° C. to about 110° C., and the reaction time is about 1 to about 15 hours. This reaction is preferably conducted under a substantial anhydrous condition to prevent polycondensation reaction of the hydrolyzable alkoxysilane (2) itself.

In the dealcoholization condensation reaction, conventionally known catalysts which do not cause ring opening of an epoxy ring may be used to accelerate the reaction. Examples of such catalysts include lithium, sodium, potassium, rubidium, cesium, magnesium, calcium, barium, strontium, zinc, aluminum, titanium, cobalt, germanium, tin, lead, antimony, arsenic, cerium, boron, cadmium, manganese and like metals; and oxides, organic acid salts, halides, alkoxides of these metals. Among them, organotin and tin organoate are particularly preferable. More specifically, dibutyltin dilaurate, tin octoate and the like are effective.

The above reaction can be performed in a solvent or without a solvent. The solvent is not particularly limited insofar as it is an organic solvent which can dissolve the bisphenol epoxy resin (1) and hydrolyzable alkoxysilane (2) and is inactive to these compounds. Examples of such organic solvent include dimethylformamide, dimethylacetamide, tetrahydrofuran, methyl ethyl ketone and like aprotic polar solvents.

The thus-obtained alkoxy-containing silane-modified epoxy resin (A) of the present invention contains, as a main component, the bisphenol epoxy resin (1) having the hydroxyl group modified with silane. The alkoxy-containing silane-modified epoxy resin (A) of the invention may contain unreacted bisphenol epoxy resin (1) and hydrolyzable alkoxysilane (2). The unreacted hydrolyzable alkoxysilane (2) can be converted to silica by hydrolysis and condensation. To promote the hydrolysis and condensation, a small amount of water may be added to the alkoxy-containing silane-modified epoxy resin (A) when used. The alkoxy-containing silane-modified epoxy resin (A) of the present invention contains alkoxy groups derived from the hydrolyzable alkoxysilane (2) in its molecule. The amount of the alkoxy groups is not critical. The alkoxy groups are necessary for forming a network-like siloxane bond therebetween by evaporation of solvents, heat treatment, or reaction with water (moisture) and for providing a mutually bonded cured product. Therefore, 50 to 95 mol %, preferably 60 to 95 mol % of the alkoxy groups of the hydrolyzable alkoxysilane (2), which is a reaction material, is left unreacted in the alkoxy-containing silane-modified epoxy resin (A). Such cured product has gelated fine silica portions (higher network structure of the siloxane bond).

The alkoxy-containing silane-modified epoxy resin (A) of the invention can be used for various applications without any restriction. In particular, the alkoxy-containing silane-modified epoxy resin (A) is preferably used as an epoxy resin composition of the present invention by combining with the curing agent (B) for epoxy resin.

When using the epoxy resin composition of the invention for various applications, various epoxy resins may be used in combination depending on the application. Examples of such epoxy resin include the above bisphenol epoxy resin (1) mentioned as the constituent of the present invention, orthocresol novolac epoxy resin, phenol novolac epoxy resin and like novolac epoxy resins; glycidyl ester epoxy resins obtainable by reacting phthalic acid, dimer acid and like polybasic acids with epichlorohydrin; glycidyl amine epoxy resin obtainable by reacting diaminodiphenylmethane, isocyanuric acid or like polyamines with epichlorohydrin; and linear aliphatic epoxy resin and alicyclic epoxy resin obtainable by oxidizing olefin bond with peracetic acid and like peracids. Low molecular weight epoxy compounds such as glycidol and the like may also be used in combination.

As the curing agent (B) for epoxy resin may be unrestrictedly used those commonly used as curing agents for epoxy resin such as phenol resin curing agents, polyamine curing agents, polycarxylic acid curing agents and the like. Specifically, phenol resin curing agents include phenol novolac resin, bisphenol novolac resin, poly p-vinylphenol and the like. The polyamine curing agents include diethylenetriamine, triethylenetetramine, tetraethylenepentamine, dicyandiamide, polyamideamine, polyamide resin, ketimine compound, isophorone diamine, m-xylenediamine, m-phenylenediamine, 1,3-bis (aminomethyl)cyclohexane, N-aminoethylpiperazine, 4,4'-diaminodiphenylmethane, 4,4'-diamino-3,3'-diethyldiphenylmethane, diaminodiphenylsulfone and the like. The polycarboxylic acid curing agents include phthalic anhydride, tetrahydrophthalic anhydride, methyltetrahydrophthalic anhydride, 3,6-endomethylenetetrahydrophthalic anhydride, hexachloroendomethylenetetrahydrophthalic anhydride, methyl-3,6-endomethylenetetrahydrophthalic anhydride and the like. The above epoxy resin curing agent (B) not only reacts with the epoxy ring to cause ring opening and curing, but also works as a catalyst for the siloxane condensation reaction of the alkoxysilyl sites in the alkoxy-containing silane-modified epoxy resin (A) and the alkoxy groups in the unreacted hydrolyzable alkoxysilane. Among the above curing agent (B) for epoxy resin, the polyamine curing agents are the most suitable as a curing catalyst for alkoxysilyl sites and alkoxy groups. Thus, the polyamine curing agents are the most suitable as a curing agent (B) for the alkoxy-containing silane-modified epoxy resin (A).

The used ratio of the curing agent (B) for epoxy resin to the alkoxy-containing silane-modified epoxy resin (A) is usually such that the equivalent ratio of the functional groups having active hydrogen in the curing agent to the epoxy groups of the alkoxy-containing silane-modified epoxy resin (A) is about 0.2 to 1.5. Examples of the above functional groups include amino group, acid anhydride group, phenolic hydroxyl group, carboxylic group, sulfonic group and the like.

In addition, the above epoxy resin composition may contain an accelerator for curing reaction between the epoxy resin and the curing agent. Examples of the accelerator include 1,8-diaza-bicyclo[5.4.0]undecene-7, triethylenediamine, benzyldimethylamine, triethanolamine, dimethylaminoethanol, tris(dimethylaminomethyl)phenol and like tertiary amines; 2-methylimidazole, 2-phenylimidazole, 2-phenyl-4-methylimidazole, 2-heptadecylimidazole and like imidazoles; tributylphosphine, methyl diphenylphosphine, triphenyl phosphine, diphenyl phosphine, phenyl phosphine and like organic phosphines; tetraphenylphosphonium* tetraphenyl borate, 2-ethyl-4-methylimidazole*tetraphenyl borate, N-methylmorpholine*tetraphenyl borate and like tetraphenyl borates. The accelerator is preferably used in an amount of 0.1 to 5 parts by weight relative to 100 parts by weight of the epoxy resin.

The concentration of the epoxy resin composition can be suitably controlled using a solvent. The solvent may be the same as that used for preparing the alkoxy-containing silane-modified epoxy resin (A). The epoxy resin composition may also contain fillers, mold releasing agents, surface modifiers, fire retardants, viscosity modifiers, plasticizers, antibacterial agents, antimolds, leveling agents, antifoaming agents, coloring agents, stabilizers, coupling agents, etc., if necessary. These additives may be used insofar as it does not lower the effects of the present invention.

The present invention can provide a cured product of an epoxy resin composition with high heat resistance and without voids (air bubbles) or the like.

The epoxy resin composition of the present invention is useful as an IC sealing material, an epoxy resin laminate plate, a coating composition, an adhesive, a coating for electric and electronic materials and for various other applications.

Figure 1:
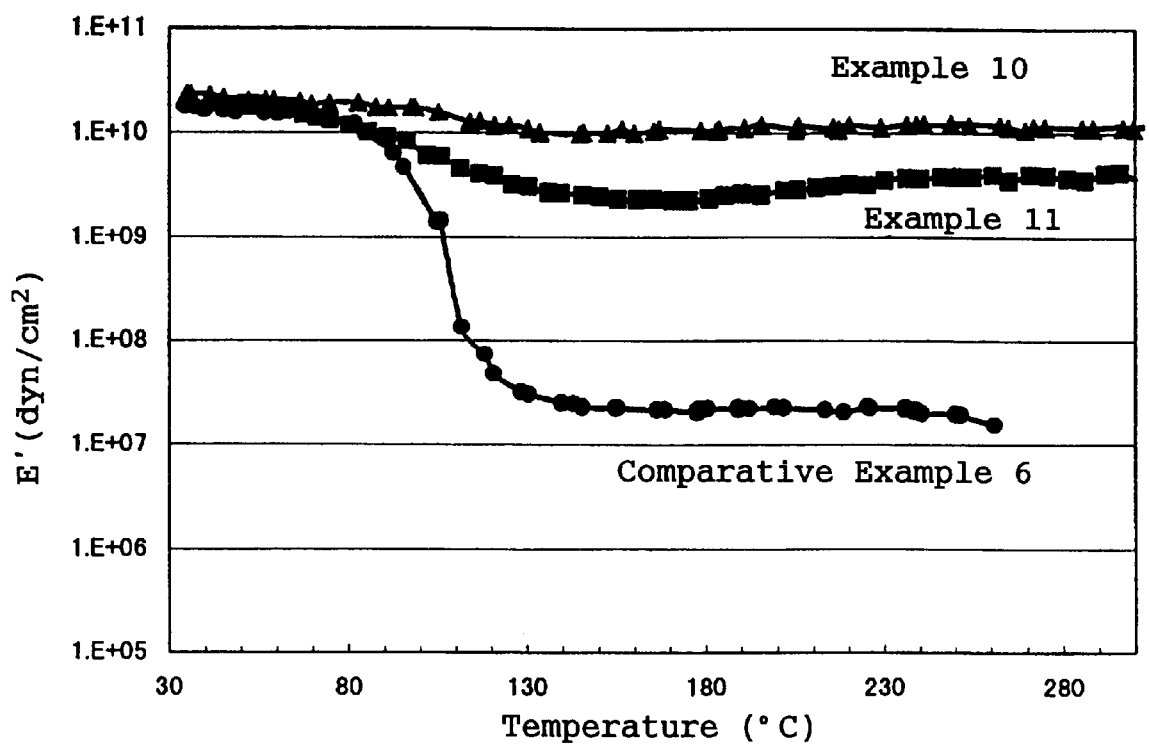
FIG. 1 indicates the evaluation results of the heat resistance of the cured films obtained using the epoxy resin compositions of Examples 10, 11 and Comparative Example 6.

In each Fig., the vertical axis represents a dynamic modulus of stored elasticity E' (dyn/cm$^2$), and the horizontal axis represents a temperature (° C.).

BEST MODE FOR CARRYING OUT THE INVENTION

The present invention is explained in further details referring to Examples and Comparative Examples below, in which percentages are by weight unless otherwise specified.

EXAMPLE 1

Preparation of alkoxy-containing silane-modified Epoxy Resin

Into a reactor equipped with a stirrer, cooling tube and thermometer were placed 850 g of bisphenol A epoxy resin (manufactured by Tohto Kasei Co., Ltd., trade name "Epotohto YD-011", in the formula (I), m=2.15, epoxy equivalent: 475 g/eq, number average molecular weight=950) and 850 g of dimethylformamide. The bisphenol A epoxy resin and dimethylformamide were dissolved at 90° C. Into the reactor were further placed 419.4 g of poly (tetramethoxysilane) (manufactured by Tama Chemicals Co., Ltd., trade name "Methyl silicate 51", n=4.0 in the formula (III)) and 2 g of dibutyltin dilaurate as a catalyst. The mixture was heated at 90° C. for 5 hours to subject to demethanolization reaction, giving a solution of an alkoxy-containing silane-modified epoxy resin. In the starting materials, (weight of the hydrolyzable methoxysilane (2) calculated as silica/the weight of the epoxy resin (1)) is 0.25, and (methoxy equivalent of the hydrolyzable methoxysilane (2)/hydroxyl equivalent of the epoxy resin (1)) is 4.6. The $^1$H-NMR analysis (CDCl$_3$ solution) of this resin solution revealed that 100% of the methin peak (about 3.3 ppm) of the epoxy ring was maintained and that the peak (about 3.85 ppm) of the hydroxyl group in the epoxy resin was reduced by about 55%. The resulting solution of the alkoxy-containing silane-modified epoxy resin had an epoxy equivalent of 1,191 g/eq.

In this specification, the epoxy equivalent of the resin solution is the amount of the solution in grams per mole of the epoxy group.

EXAMPLE 2

Preparation of alkoxy-containing silane-modified Epoxy Resin

Into the same reactor as in Example 1 were placed 800 g of "Epotohto YD-011" and 800 g of dimethylformamide. The mixture was dissolved at 90° C. To the mixture were further added 523.5 g of "Methyl Silicate 51" and 2 g of dibutyltin dilaurate. The mixture underwent demethanolization reaction at 90° C. for 5 hours, giving a solution of an alkoxy-containing silane-modified epoxy resin. In the starting materials, (the weight of the hydrolyzable methoxysilane (2) calculated as silica/the weight of the epoxy resin (1)) is 0.33, and (methoxy equivalent of the hydrolyzable methoxysilane (2)/hydroxyl equivalent of the epoxy resin (1)) is 6.1. The $^1$H-NMR analysis (CDCl$_3$ solution) of this resin solution revealed that 100% of the methin peak (about 3.3 ppm) of the epoxy ring was maintained and that the peak (about 3.85 ppm) of the hydroxyl group in the epoxy resin was reduced by about 50%. The resulting solution of the alkoxy-containing silane-modified epoxy resin had an epoxy equivalent of 1,269 g/eq.

EXAMPLE 3

Preparation of alkoxy-containing silane-modified Epoxy Resin

Into the same reactor as in Example 1 were placed 850 g of "Epotohto YD-011" and 850 g of methyl ethyl ketone. The mixture was dissolved at 70° C. To the mixture were further added 419.4 g of "Methyl Silicate 51" and 2 g of dibutyltin dilaurate. The mixture underwent demethanolization reaction at 90° C. for 5 hours, giving a solution of an alkoxy-containing silane-modified epoxy resin. In the starting materials, (the weight of the hydrolyzable methoxysilane (2) calculated as silica/the weight of the epoxy resin (1)) is 0.25, and (methoxy equivalent of the hydrolyzable methoxysilane (2)/hydroxyl equivalent of the epoxy resin (1)) is 4.6. The $^1$H-NMR analysis (CDCl$_3$ solution) of this resin solution revealed that 100% of the methin peak (about 3.3 ppm) of the epoxy ring was maintained and that the peak (about 3.85 ppm) of the hydroxyl group of the epoxy resin was reduced by about 60%. The resulting solution of the alkoxy-containing silane-modified epoxy resin had an epoxy equivalent of 1,191 g/eq.

EXAMPLE 4

Preparation of alkoxy-containing silane-modified Epoxy Resin

Into the same reactor as in Example 1 were placed 950 g of a bisphenol A epoxy resin (manufactured by Tohto Kasei Co., Ltd., trade name "Epotohto YD-127", m=0.11 in the formula (I), epoxy equivalent: 185 g/eq, number average molecular weight=370) and 950 g of dimethylformamide. The mixture was dissolved at 900° C. To the mixture were further added 304.6 g of "Methyl Silicate 51" and 2 g of dibutyltin dilaurate. The mixture underwent demethanolization reaction at 90° C. for 6 hours, giving a solution of an alkoxy-containing silane-modified epoxy resin. In the starting materials, (the weight of the hydrolyzable methoxysilane (2) calculated as silica/the the weight of the epoxy resin (1)) is 0.14, and (methoxy equivalent of the hydrolyzable methoxysilane (2)/hydroxyl equivalent of the epoxy resin (1)) is 23.7. In this Example, methanol produced during the reaction was removed from the reaction system to complete the dealcoholization reaction. The $^1$H-NMR analysis (CDCl$_3$ solution) of this resin solution revealed that 100% of the methin peak (about 3.3 ppm) of the epoxy ring was maintained and that the peak (about 3.8 ppm) of the hydroxyl group in the epoxy resin had completely disappeared. The resulting solution of the alkoxy-containing silane-modified epoxy resin had an epoxy equivalent of 431 g/eq.

EXAMPLE 5

Preparation of alkoxy-containing silane-modified Epoxy Resin

Into the same reactor as in Example 1 were placed 450 g of "Epotohto YD-011" and 1,000 g of methyl isobutyl ketone. The mixture was dissolved at 90° C. To the mixture were further added 1,207 g of "Methyl Silicate 51" and 2 g of dibutyltin dilaurate. The mixture was allowed to react at 90° C. for 5 hours while removing methanol from the mixture. The mixture was cooled to 50° C. and placed under reduced pressure of 13.3 kPa for 30 minutes, whereby the remaining methanol and 500 g of methyl isobutyl ketone were removed from the mixture, giving a solution of an alkoxy-containing silane-modified epoxy resin. In the starting materials, (the weight of the hydrolyzable methoxysilane (2) calculated as silica/the weight of the epoxy resin (1)) is 1.41, and (methoxy equivalent of the hydrolyzable methoxysilane (2)/hydroxyl equivalent of the epoxy resin (1)) is 25.0. The $^1$H-NMR analysis (CDCl$_3$ solution) of this resin solution revealed that 100% of the methin peak (about 3.3 ppm) of the epoxy ring was maintained and that the peak (about 3.85 ppm) of the hydroxyl group in the epoxy resin had completely disappeared. The resulting solution of the alkoxy-containing silane-modified epoxy resin had an epoxy equivalent of 2,300 g/eq.

EXAMPLE 6

Preparation of alkoxy-containing silane-modified Epoxy Resin

Into the same reactor as in Example 1 were placed 800 g of "Epotohto YD-011" and 800 g of methyl ethyl ketone. The mixture was dissolved at 70° C. To the mixture were further added 348.6 g of "Methyl Silicate 51", 178.1 g of methyltrimethoxysilane and 2 g of dibutyltin dilaurate as a catalyst. The mixture underwent demethanolization reaction at 80° C. for 6 hours, giving a solution of a silane-modified epoxy resin. In the starting materials, (the weight of the hydrolyzable methoxysilane (2) calculated as silica/the weight of the epoxy resin (1)) is 0.33, and (methoxy equivalent of the hydrolyzable methoxysilane (2)/hydroxyl equivalent of the epoxy resin (1)) is 6.2. In this Example, methanol produced during the reaction was removed from the reaction system to efficiently conduct the dealcoholization reaction. During the reaction, about 40 g of methanol was removed from the reaction system. The $^1$H-NMR analyses (CDCl$_3$ solution) of this resin solution and the raw material, bisphenol A epoxy resin, were compared. Accordingly, it was revealed that 100% of the methin peak (about 3.3 ppm) of the epoxy ring was maintained and that the peak (about 3.85 ppm) of the hydroxyl group in the epoxy resin was reduced by about 75% in this resin solution. In addition, the peaks of methoxy groups and methyl groups (about 3.6 ppm and about 0.1 ppm, respectively) which were newly bonded to Si were found. The resulting solution of the silane-modified epoxy resin had an epoxy equivalent of 1,240 g/ep.

EXAMPLE 7

Preparation of alkoxy-containing silane-modified Epoxy Resin

Into the same reactor as in Example 1 were placed 950 g of "Epotohto YD-011" and 950 g of methyl ethyl ketone. The mixture was dissolved at 70° C. To the mixture were further added 208.8 g of methyltrimethoxysilane and 2 g of dibutyltin dilaurate as a catalyst. The mixture underwent demethanolization reaction at 80° C. for 7 hours, giving a solution of a silane-modified epoxy resin. In the starting materials, (the weight of the hydrolyzable methoxysilane (2) calculated as silica/the weight of the epoxy resin (1)) is 0.11, and (methoxy equivalent of the hydrolyzable methoxysilane (2)/hydroxyl equivalent of the epoxy resin (1)) is 2.1. In this Example, methanol produced during the reaction was removed from the reaction system to efficiently conduct the dealcoholization reaction. During the reaction, about 60 g of methanol was removed from the reaction system. The $^1$H-NMR analyses (CDCl$_3$ solution) of this resin solution and the raw material, bisphenol A epoxy resin, were compared. Accordingly, it was revealed that 100% of the methin peak (about 3.3 ppm) of the epoxy ring was maintained and that the peak (about 3.85 ppm) of the hydroxyl group in the epoxy resin was reduced by about 90% in this resin solution. In addition, the peaks of methoxy groups and methyl groups (about 3.6 ppm and about 0.1 ppm, respectively) which were newly bonded to Si were found. The resulting solution of the silane-modified epoxy resin had an epoxy equivalent of 1,035 g/ep.

EXAMPLE 8

Preparation of alkoxy-containing silane-modified Epoxy Resin

Into the same reactor as in Example 1 were placed 950 g of "Epotohto YD-011" and 1,000 g of methyl ethyl ketone. The mixture was dissolved at 70° C. To the mixture were further added 201.4 g of a condensate of methyltrimethoxysilane (manufactured by Tama Chemicals Co., Ltd., prototype "MTMS-A"), 201.4 g of "Methyl Silicate 51" and 2 g of dibutyltin dilaurate as a catalyst. The mixture underwent demethanolization reaction at 80° C. for 7 hours, giving a solution of a silane-modified epoxy resin. In the starting materials, (the weight of the hydrolyzable methoxysilane (2) calculated as silica/the weight of the epoxy resin (1)) is 0.25, and (methoxy equivalent of the hydrolyzable methoxysilane (2)/hydroxyl equivalent of the epoxy resin (1)) is 3.4. The $^1$H-NMR analyses (CDCl$_3$ solution) of this resin solution and the raw material, bisphenol A epoxy resin, were compared. Accordingly, it was revealed that 100% of the methin peak (about 3.3 ppm) of the epoxy ring was maintained and that the peak (about 3.85 ppm) of the hydroxyl group in the epoxy resin was reduced by about 50% in this resin solution. In addition, the peaks of methoxy groups and methyl groups (about 3.6 ppm and about 0.1 ppm, respectively) which were newly bonded to Si were found. The resulting solution of the silane-modified epoxy resin had an epoxy equivalent of 1,182 g/ep.

Comparative Example 1

"Epotohto YD-011" was dissolved in dimethylformamide, giving a resin solution having a nonvolatile content of 50%. This epoxy resin solution had an epoxy equivalent of 950 g/eq.

Comparative Example 2

To 85 g of "Epotohto YD-011" were added 85 g of dimethylformamide and 41.9 g of "Methyl Silicate 51", giving a solution of a mixture of epoxy resin and alkoxysilane. This solution had an epoxy equivalent of 1,200 g/eq.

Comparative Example 3

To 85 g of "Epotohto YD-011" were added 68.6 g of dimethylformamide and 41.9 g of "Methyl Silicate 51", giving a solution of a mixture of epoxy resin and alkoxysilane. This solution had an epoxy equivalent of 1,090 g/eq.

Comparative Example 4

"Epotohto YD-127" was dissolved in dimethylformamide, giving a resin solution having a nonvolatile content of 50%. This epoxy resin solution had an epoxy equivalent of 370 g/eq.

Comparative Example 5

"Epotohto YD-011" was dissolved in methyl ethyl ketone, giving a resin solution having a nonvolatile content of 50%. This epoxy resin solution had an epoxy equivalent of 950 g/eq.

EXAMPLES 9 to 12

Epoxy resin compositions were prepared by adding a 15% solution of dicyandiamide in dimethylformamide to the respective resin solutions obtained in Examples 1 to 4 in such an amount that amino equivalent of dicyandiamide/epoxy equivalent of the resin solution is 0.8.

EXAMPLE 13

The resin solutions obtained in Example 5 and Comparative Example 1 were mixed at a weight ratio of 1:1. To this mixture was added a 15% solution of dicyandiamide in dimethylformamide in such an amount that the amino equivalent of dicyandiamide/the epoxy equivalent of the resin solution is 0.8, giving an epoxy resin composition.

EXAMPLES 14 to 16

Epoxy resin compositions were prepared by adding triethylenetetramine to the respective resin solutions obtained in Examples 6 to 8 in such an amount that amino equivalent of triethylenetetramine/epoxy equivalent of the resin solution is 0.8.

Comparative Examples 6, 7 and 9

Epoxy resin compositions were prepared by adding a 15% solution of dicyandiamide in dimethylformamide to the respective resin solutions of Comparative Examples 1, 2 and 4 in such an amount that amino equivalent of dicyandiamide/epoxy equivalent of the resin solution is 0.8.

Comparative Example 8

To the resin solution of Comparative Example 3 were added 20.1 g of a 15% solution dicyandiamide in dimethylformamide (amino equivalent in dicyandiamide/epoxy equivalent of the resin solution=0.8) and 16.4 g of water. The mixture underwent sol-gel reaction at room temperature for 2 hours. This mixture formed a gel when being left to stand for 3 hours after the reaction.

Comparative Example 10

An epoxy resin composition was prepared by adding triethylenetetramine to the resin solution obtained in Comparative Example 5 in such an amount that amino equivalent of triethylenetetramine/epoxy equivalent of the resin solution is 0.8.

Evaluation of Bubble, Shrinkage and Appearance of Cured Product

The epoxy resin compositions obtained in Examples and Comparative Examples were placed into separate containers (length×width×height=10 cm×10 cm×1.5 cm) with fluororesin coatings. The removal of solvents from the compositions and curing of the compositions were carried out at 135° C. for 1 hour and then at 175° C. for 2 hours, giving film-like cured products. The degrees of bubble and shrinkage and appearance of the cured products were rated on the following scales.

The scale for evaluating the degree of bubble is as follows. A: The cured product has no bubbles, B: The cured product has 1–4 bubbles, C: The cured product has 5 bubbles or more.

The scale for evaluating the degree of shrinkage is as follows. A: The cured product has no cracks, B: The cured product has some cracks, C: The cured product has many cracks.

The scale for evaluating the appearance of the cured product is as follows. A: The cured product is transparent, B: The cured product has haze, C: The cured product is whitened.

The results are shown in Table 1.

TABLE 1

|  | Bubble | Shrinkage | Appearance |
| --- | --- | --- | --- |
| Example 9 | A | A | A |
| Example 10 | A | A | A |
| Example 11 | A | A | A |
| Example 12 | A | A | A |
| Example 13 | A | A | A |
| Example 14 | A | A | A |
| Example 15 | A | A | A |
| Example 16 | A | A | A |
| Comparative Example 6 | A | A | A |
| Comparative Example 7 | B | B | C |
| Comparative Example 8 | C | C | C |
| Comparative Example 9 | A | A | A |
| Comparative Example 10 | A | A | A |

The results shown in Table 1 indicate that the epoxy resin composition of Examples were capable of forming transparent cured films (about 0.4 mm in thickness). On the other hand, the epoxy resin composition of Comparative Example 8 underwent considerable foaming and shrinkage during curing and was unable to form a practical cured film. Although the epoxy resin composition of Comparative Example 7 was able to form a cured film, the cured film was whitened because of the phase separation of epoxy resin and silica and was very brittle.

Evaluation of Heat Resistance of Cured Product

The cured films produced by using the resin compositions obtained in Examples 10–16, Comparative Examples 6, 9 and 10 were cut into pieces (6 mm×25 mm). The test pieces were tested for their dynamic modulus of stored elasticity by viscoelasticity meter ("DVE-V4" produced by Rheology Corporation, trade name, measurement conditions: amplitude: 1 μm, frequency: 10 Hz, slope: 3° C./min.). The heat resistance of the test pieces was evaluated based on the measurement of the dynamic modulus of stored elasticity. The results of measurement are shown in FIG. 1, FIG. 2 and FIG. 3.

FIG. 1 shows that the cured film (cured product of epoxy resin) of Comparative Example 6 has underwent glass transition; the glass transition temperature of the cured film of Example 10 is not observed at all; and the glass transition temperature of the cured film of Example 11 is not observed. These facts shows that the cured films of Examples do not undergo glass transition at a high temperature and thus have high heat resistance. Although not shown in Figs., Example 13 exhibited the same results as Example 10.

Figure 2:
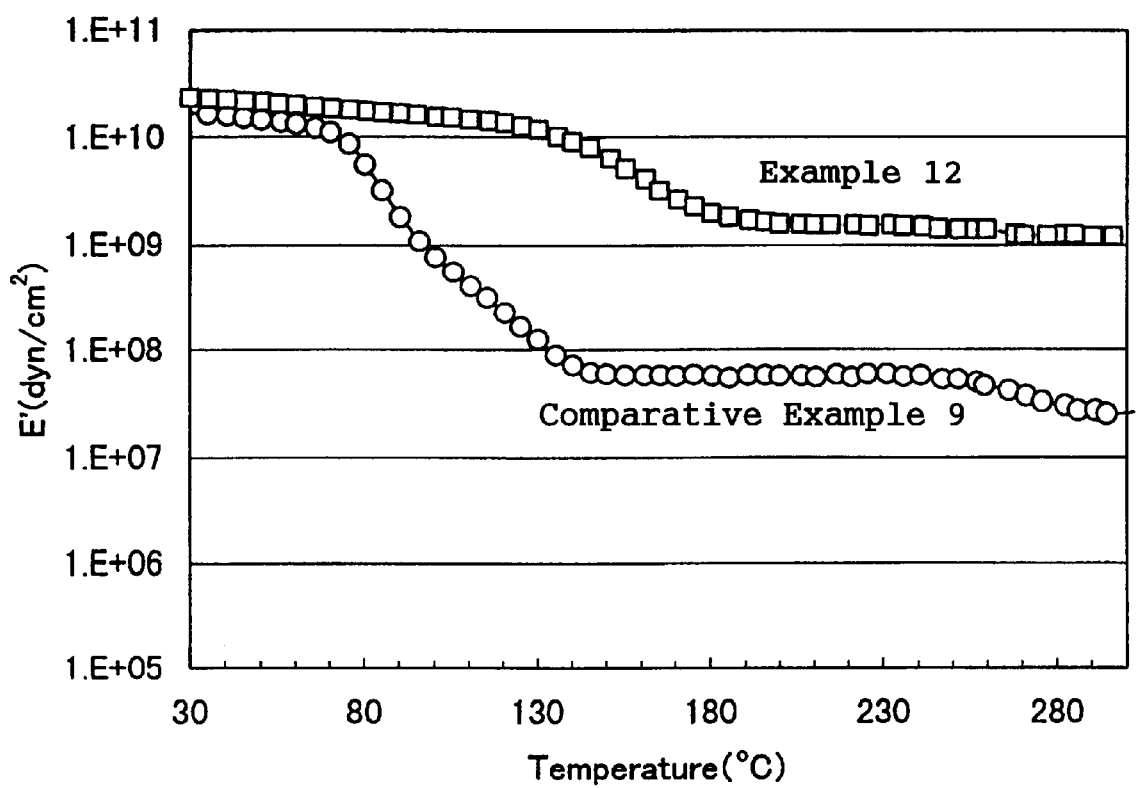
FIG. 2 indicates the evaluation results of the heat resistance of the cured films obtained using the epoxy resin compositions of Example 12 and Comparative Example 9.

FIG. 2 shows that the cured film of Example 12 has a higher glass transition temperature (Tg) than Comparative Example 9, and therefore is excellent in modulus of elasticity at high temperatures and heat resistance.

Figure 3:
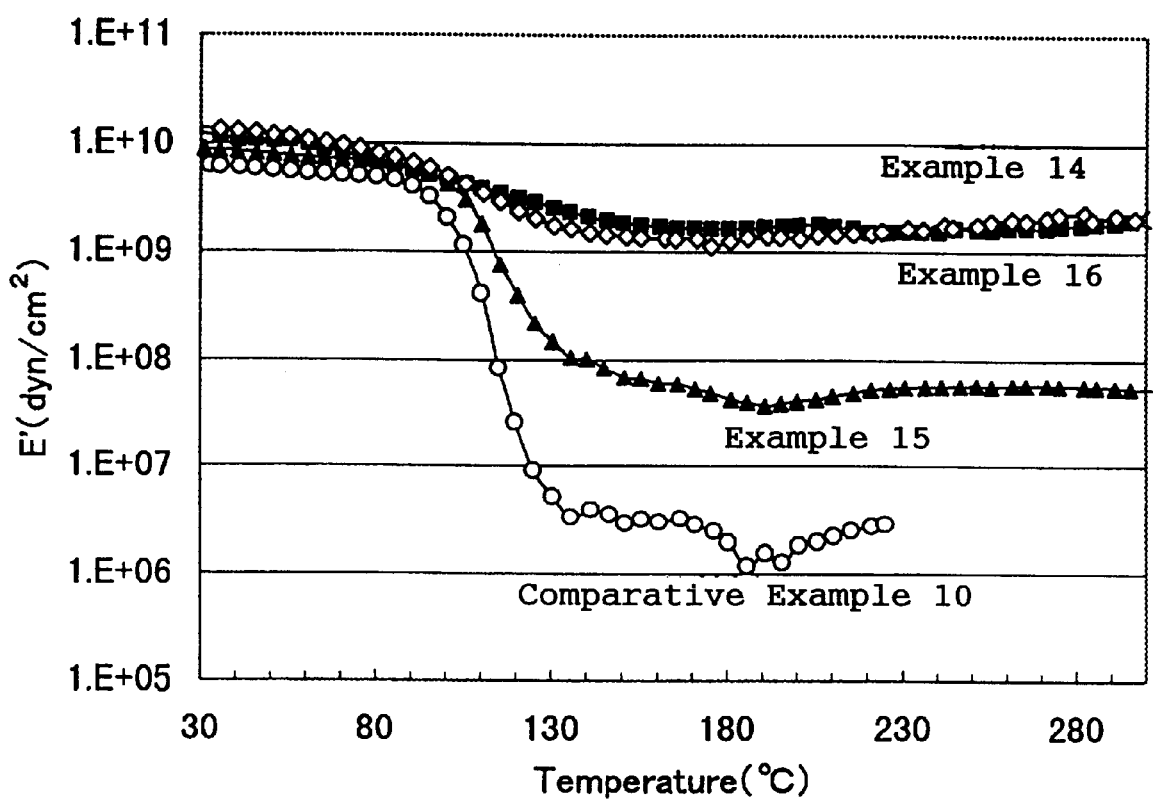
FIG. 3 indicates the evaluation results of the heat resistance of the cured films obtained using the epoxy resin compositions of Examples 14, 15, 16 and Comparative Example 10.

FIG. 3 shows that the cured film (epoxy resin cured product) of Comparative Example 10 has underwent glass transition, while the glass transition temperature of the cured films of Examples 14 and 16 are not observed. Although the cured film of Example 15 exhibits glass transition, it has a higher glass transition temperature (Tg) than the cured film of Comparative Example 10, and therefore is excellent in modulus of elasticity at high temperatures and heat resistance.

What is claimed is:

1. An epoxy resin composition comprising an alkoxy-containing silane-modified epoxy resin (A) which is obtainable by dealcoholization condensation reaction between a bisphenol epoxy resin (1) and hydrolyzable alkoxysilane (2); and a curing agent (B) for epoxy resin, wherein the hydrolyzable alkoxysilane (2) comprises alkoxy groups and 50 to 95 mol % of the alkoxy groups are left unreacted in the alkoxy-containing silane-modified epoxy resin (A).

2. The epoxy resin composition according to claim 1, wherein an epoxy equivalent of the bisphenol epoxy resin (1) is about 180 to about 5,000 g/eq.

3. The epoxy resin composition according to claim 1, wherein the bisphenol epoxy resin (1) is a compound represented by the formula (I)

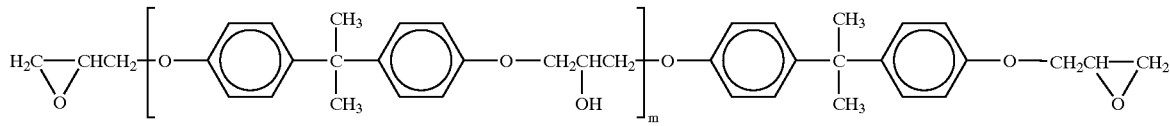

(wherein the average of m is 0.07 to 16.4).

4. The epoxy resin composition according to claim 1, wherein the hydrolyzable alkoxysilane (2) is a compound represented by the formula $$R^1_p Si(OR^2)_{4-p}$$ (II)

(wherein p is 0 or 1; $R^1$ represents a $C_1$–$C_8$ alkyl group, aryl group or unsaturated aliphatic hydrocarbon group which may have a functional group directly bonded to a carbon atom; $R^2$ represents a hydrogen atom or a lower alkyl group and $R^2$'s may be the same or different) or a partial condensate thereof.

5. The epoxy resin composition according to claim 1, wherein the hydrolyzable alkoxysilane (2) is poly (tetramethoxysilane) represented by the formula (III)

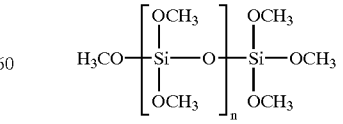

(wherein the average of n is 1 to 7).

6. The epoxy resin composition according to claim 5, wherein the number average molecular weight of the poly (tetramethoxysilane) is about 260 to about 1,200.

7. The epoxy resin composition according to claim 1, wherein the bisphenol epoxy resin (1) and the hydrolyzable alkoxysilane (2) are used in such an amount that the weight of the hydrolyzable alkoxysilane (2) calculated as silica/the weight of the bisphenol epoxy resin (1) is 0.01 to 3.

8. The epoxy resin composition according to claim 1, wherein the curing agent (B) for epoxy resin is a polyamine curing agent.

9. A method for preparing an alkoxy-containing silane-modified epoxy resin (A), the method comprising dealcoholization condensation reaction between the bisphenol epoxy resin (1) and the hydrolyzable alkoxysilane (2), wherein the hydrolyzable alkoxysilane (2) comprises alkoxy groups and 50 to 95 mol % of the alkoxy groups are left unreacted in the alkoxy-containing silane-modified epoxy resin (A).

10. An alkoxy-containing silane-modified epoxy resin which is obtainable by the method of claim 9.

11. The epoxy resin composition according to claim 1, wherein 60 to 95 mol % of the alkoxy groups of the hydrolyzable alkoxysilane (2) are left unreacted in the alkoxy-containing silane-modified epoxy resin (A).

12. The method according to claim 9, wherein 60 to 95 mol % of the alkoxy groups of the hydrolyzable alkoxysilane (2) are left unreacted in the alkoxy-containing silane-modified epoxy resin (A).

* * * * *